United States Patent [19]

Flaitz et al.

[11] Patent Number: 4,764,341

[45] Date of Patent: Aug. 16, 1988

[54] BONDING OF PURE METAL FILMS TO CERAMICS

[75] Inventors: Philip L. Flaitz, Poughkeepsie; Raj N. Master; Paul H. Palmateer, both of Wappingers Falls; Srinivasa S. N. Reddy, LaGrangeville, all of N.Y.

[73] Assignee: International Business Machines Corporation, Armonk, N.Y.

[21] Appl. No.: 42,756

[22] Filed: Apr. 27, 1987

[51] Int. Cl.$^4$ .................................................. B22F 7/00
[52] U.S. Cl. ........................................ 419/9; 228/122; 419/5; 419/19; 428/420; 428/469; 428/472.1; 428/552; 428/632; 428/633
[58] Field of Search ..................... 428/469, 420, 472.1, 428/632, 633, 552; 228/122; 419/5, 9, 19

[56] References Cited

U.S. PATENT DOCUMENTS

| | | | |
|---|---|---|---|
| 4,050,956 | 9/1977 | Bruin et al. | 228/122 |
| 4,505,418 | 3/1985 | Neidig et al. | 228/122 |
| 4,613,549 | 9/1986 | Tanaka | 428/469 |

*Primary Examiner*—Stephen J. Lechert, Jr.
*Attorney, Agent, or Firm*—Anne Vachon Dougherty

[57] ABSTRACT

The bonding of nickel, cobalt, copper or any number of metals to oxide ceramics is achieved whereby the substrate and associated metallurgy are co-sintered. The invention teaches the use of an intermediary oxide such as Al2O3, Cr2O3, TiO2 r ZrO2 which will adhere to the substrate and in the presence of firing ambients form a complex ternary oxide with the overlying metal thereby creating the desired bond. The eutectic can be created during the firing cycle without the undesired consequence of oxidizing the metal. The so-called intermediary oxides can be oxidized in situ, deposited as oxides, or introduced into either the ceramic composition or the metal paste.

16 Claims, 1 Drawing Sheet

① $4Cu+O_2=2Cu_2O$
② 99.95% $H_2O$ + 0.05% $H_2$
③ $2Ni+O_2=2NiO$
④ 99% $H_2O$ + 1% $H_2$
⑤ $2Ni+O_2+2.54 Al_2O_3 = 2.54 NiAl_{2.54}O_{4.81}$
⑥ $2Ni+O_2+2Cr_2O_3 = 2NiCr_2O_4$
⑦ $2Ni+O_2+2TiO_2 = 2NiTiO_3$
⑧ $C+O_2=CO_2$

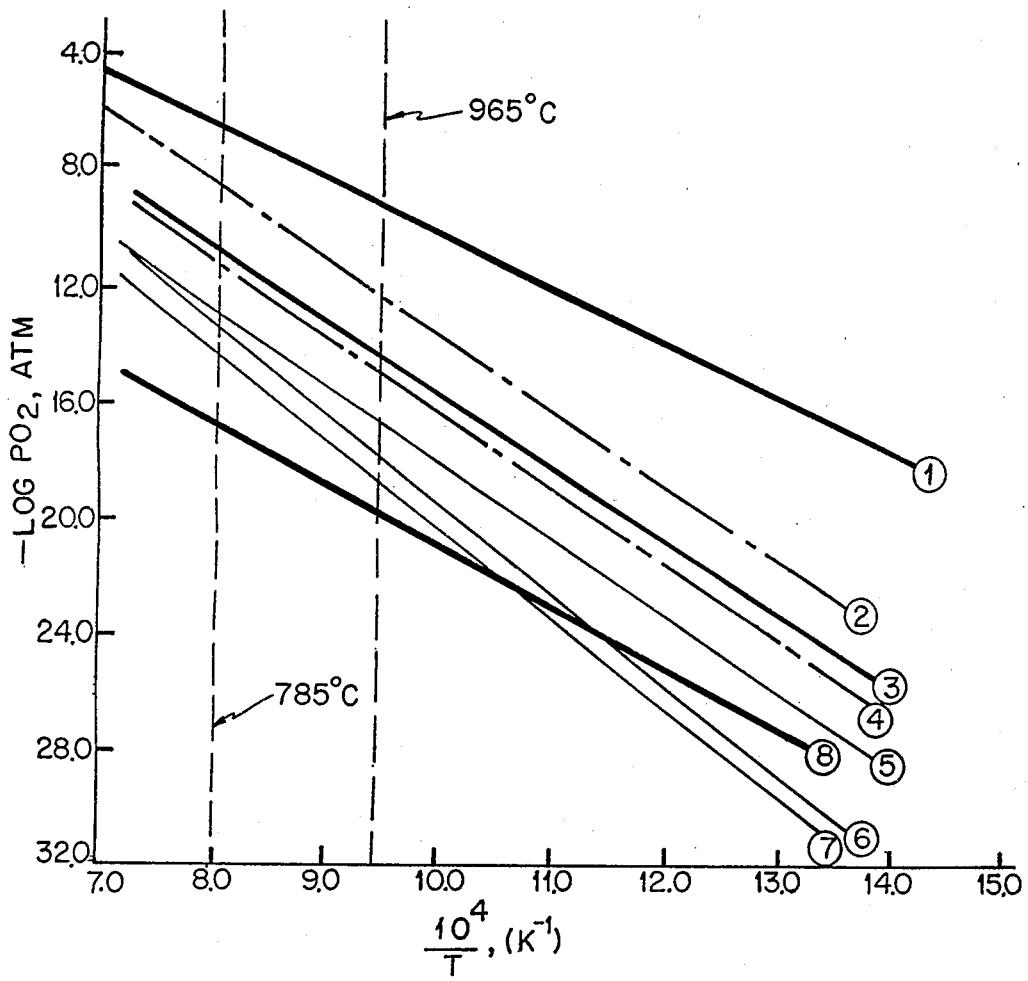
① $4Cu + O_2 = 2Cu_2O$
② $99.95\% \ H_2O + 0.05\% \ H_2$
③ $2Ni + O_2 = 2NiO$
④ $99\% \ H_2O + 1\% \ H_2$
⑤ $2Ni + O_2 + 2.54 Al_2O_3 = 2.54 NiAl_{2.54}O_{4.81}$
⑥ $2Ni + O_2 + 2Cr_2O_3 = 2NiCr_2O_4$
⑦ $2Ni + O_2 + 2TiO_2 = 2NiTiO_3$
⑧ $C + O_2 = CO_2$

BONDING OF PURE METAL FILMS TO CERAMICS

The invention relates to the bonding of pure metal films to ceramics. More particularly, the invention teaches several methods of promoting and enhancing the quality of the bonds between oxide ceramics and associated metallurgy. Examples taught include the bonding of nickel films and copper films and/or vias to oxide ceramics wherein the adherent metallurgy is applied to the ceramic in the ceramic's "green state" and the combination is co-fired.

BACKGROUND OF THE INVENTION

In the formation of printed circuit boards, magnetic storage devices, multilayer substrates and other metallized ceramic applications, a pervasive problem is the bonding of a pure metal to an oxide-based ceramic. The methods attempted in the past have included the use of a metal oxide of the metal to be joined with the ceramic, a so-called cermet compound, as taught in Japanese patent application No. 60-108379 and European application No. 147360. U.S. Pat. No. 3,975,165 teaches the use of a graded interface wherein successive layers are deposited between the ceramic and the metal and wherein each successive layer has a higher metallic content than its underlying layer. Still another approach has been taught wherein a pre-reacted intermetallic layer is deposited on the ceramic to enhance the bonding as taught in European application No. 146493. The previously practiced bonding enhancement techniques have improved the bonding of the associated materials per se but have not resulted in bonds which are sufficiently strong to withstand the additional stress of device or interconnector joining.

It is therefore an object of the subject invention to provide improved methods of joining metals to oxide ceramics.

It is a further objective of the invention to provide intermediate materials which can enhance the bonding of the associated materials without altering the electrical properties of the materials.

It is still another objective of the subject invention to provide the materials and methods for metallizing a ceramic in its green state and co-firing the combination.

SUMMARY OF THE INVENTION

The bonding of nickel, cobalt, copper or any of a number of metals or alloys of these metals to a oxide ceramic substrate is achieved whereby the substrate and associated metallurgy are co-sintered. The invention teaches the use of an intermediary oxide such as Al2O3, Cr2O3, TiO2 or ZrO2 which will adhere to the substrate and, in the presence of the firing ambients, form a complex ternary oxide with the associated metal, thereby creating the desired bond. The so-called intermediary oxides can be oxidized in situ, deposited as oxides, introduced in the metal paste or introduced in the ceramic material.

The invention will now be described with reference to the FIGURE wherein the thermodymanics of the reaction of nickel and the various intermediary oxides are plotted by way of example and wherein:

Line 1 is plotted for the reaction $4Cu + O_2 = 2Cu_2O$
Line 2 is plotted for 99.95% $H_2O + 0.05\%$ $H_2$
Line 3 is plotted for the reaction $2Ni + O_2 = 2NiO$
Line 4 is plotted for 99% $H_2O + 1\%$ $H_2$
Line 5 is plotted for $2Ni + O_2 2.54Al_2O_3 = 2.54NiAl_{2.54}O_{4.81}$
Line 6 is plotted for the reaction $2Ni + O_2 + 2Cr_2O_3 = 2NiCr_2O_4$
Line 7 is plotted for the reaction $2Ni + O_2 + 2TiO_2 = 2NiTiO_3$
Line 8 is plotted for the reaction $C + O_2 = CO_2$.

DETAILED DESCRIPTION OF THE PREFERRED EMBODIMENT

The invention is both a method and a structure whereby metals are joined to oxide ceramics by the interaction of the metal and an intermediary oxide. When a metal and ceramic are brought together, bonding occurs when the interfacial energy is less that the sum of the surface energies of the metal and the ceramic. Such a low energy interface is formed when the atoms of the ceramic and the metal are mixed and their valence electrons interact attractively. In the subject invention, a compound is created between the metal and the ceramic which allows bonding. The compound, a complex oxide, is created during the firing of the associated materials with an intermediary oxide without the undesirable consequence of oxidizing the metal. In a generic sense, the invention can be described as follows: The desired structure after firing is the following: ceramic/ $ABO_{m+n}$/A(metal) where the complex oxide is a reaction product between $AO_m$ and $BO_n$. If the ceramic already contains $BO_n$, then only metal A is deposited on the ceramic. The complex oxide forms during high temperature processing. If the ceramic does not contain $BO_n$, then metal B is first deposited followed by the deposition of metal A. On subsequent heat treatment, the complex oxide will form at the interface and produce the bond.

By way of example, the invention will be taught with reference to a specific material set wherein a nickel film is to be deposited on an oxide ceramic. Again, the firing cycle must be such that the nickel is not oxidized, yet sufficiently oxidative to ensure removal of carbon from the ceramic binder. As such, and with reference to FIG. 1, the oxygen potential in the gas must be above line 8 and below line 3, i.e. sufficient to ensure the formation of CO2 and insufficient to form NiO. As is evident from the Figure, the oxygen potential for formation of NiO in the gaseous phase is higher than that required to form the ternary compounds, line 5 for NiAl2O4, line 6 for NiCr2O4 and line 7 for NiTiO3.

The introduction of the intermediary oxide may be accomplished in one of a plurality of ways. Our first example includes the introduction of the intermediary compound to the nickel paste. Al2O3, Cr2O3, TiO2 or ZrO2, by way of example, may be added to the metal paste prior to screening the paste onto the ceramic. During sintering in an atmosphere containing 99% volume steam and 1% volume $H_2$, at a highest temperature of 965° C., by way of example, NiAl2O4, NiCr2O4, NiTiO3 or NiZrO3 will be formed at the interface between the metal and the ceramic promoting chemical bonding at the interface. Alternatively, the ternary compound itself, i.e. the NiAl2O4, NiCr2O4, NiTiO3 or NiZrO3 powder can be included in the Ni paste and the same sintering profile be followed. Should it be desirable to adhere Ni or another metal to a pre-fired ceramic, a thin layer of Al, Cr, Ti, or Zr for example, may be deposited on the fired part and oxidized in situ. The nickel could then be deposited on the oxide and sintered in an atmosphere represented by line 4 in FIG. 1. Once again, the ternary oxide could be added to the nickel paste itself and the part sintered. The intermediary oxide may be added to the glass as opposed to adding it to the paste. Additions to the ceramic composition are most efficient when the additions are made prior to the mixing of a slurry. Therefore, in the subsequent milling and casting, the additions will be uniformly distributed throughout the dielectric material such that the intermediary material will be uniformly available to the metal-ceramic interfaces for bonding.

The invention has been taught with reference to a specific example and material set. It will be evident to one having skill in the art that the invention may be practiced in a number of ways whereby a compound is formed by the use of an intermediary ternary oxide to promote the bonding of the associated metal and oxides. One may substitute materials and methods for introducing the same into the composite body without straying from the spirit of the invention and the scope of the appended claims.

What is claimed is:

1. A method of bonding metal to a first oxide comprising:
   forming a ternary oxide comprising said metal at the interface of said metal and said first oxide.

2. The method of claim 1, wherein said ternary oxide is formed by the steps comprising:
   providing a layer of an intermediary oxide between said metal and said first oxide, said intermediary oxide being chosen to interact with said metal to form a ternary oxide upon firing; and
   firing said structure at a temperature sufficient to create said ternary oxide.

3. The method of claim 1, wherein said metal is nickel and said ternary oxide comprises one of a group consisting of $NiAl_2O_4$, $NiCr_2O_4$, $NiTiO_3$ and $NiZrO_3$.

4. The method of claim 1 wherein said ternary oxide is formed by the steps comprising:
   providing an intermediary oxide to said metal, said intermediary oxide being chosen to form a ternary oxide with said metal upon firing;
   depositing said metal and intermediary oxide on said first oxide;
   firing said metal, intermediary oxide and first oxide to a temperature sufficient to create said ternary oxide.

5. The method of claim 1 wherein said ternary oxide is formed by the steps comprising:
   providing an intermediary oxide to said first oxide, said intermediary oxide chosen to form a ternary oxide with said metal upon firing;
   depositing said metal on said intermediary and first oxide; and
   firing said metal, intermediary and first oxide to a temperature sufficient to create said ternary oxide.

6. The method of claim 4 and 5 wherein said intermediary oxide is selected from the group consisting of $Al_2O_3$, $Cr_2O_3$, $TiO_2$ and $ZrO_2$.

7. A method of bonding a metal to an oxide ceramic substrate comprising the steps of;
   forming a ternary oxide between said metal and said substrate.

8. The method of claim 7 wherein said ternary oxide is formed during high temperature firing.

9. The method of claim 7 wherein said forming of said ternary oxide comprises the steps of:
   providing an intermediary oxide to said metal said intermediary oxide being selected to form a ternary oxide with said metal upon high temperature firing;
   depositing said metal and intermediary oxide to said substrate;
   firing said structure at a temperature sufficient to form said ternary oxide.

10. The method of claim 7 wherein said forming of said ternary oxide comprises the steps of:
    providing an intermediary oxide to said substrate, said intermediary oxide being selected to form a ternary oxide with said metal upon firing;
    depositing said metal on said substrate;
    firing said structure at a temperature sufficient to form said ternary oxide.

11. The method of claims 9 and 10 wherein said intermediary oxide is selected from a group consisting of $Al_2O_3$, $Cr_2O_3$, $TiO_2$ and $ZrO_2$.

12. A method for fabricating a metallized ceramic substrate comprising the steps of:
    mixing a ceramic slurry;
    casting greensheets from said slurry;
    drying said greensheets;
    depositing metal on said greensheets;
    providing an intermediary oxide to said structure, said intermediary oxide being chosen to form a ternary oxide with said metal upon firing; and
    firing said metallized greensheets and thereby forming a ternary oxide between said metal and said ceramic.

13. The method of claim 12 wherein said providing of an intermediary oxide comprises the steps of;
    providing ternary compounds to said metal prior to said depositing step.

14. The method of claim 12 wherein said providing of an intermediary oxide comprises the steps of;
    providing an intermediary oxide to said metal prior to said depositing step.

15. The method of claim 12 wherein said providing of an intermediary oxide comprises the steps of;
    providing an intermediary oxide to said slurry during mixing.

16. A metallized oxide ceramic structure comprising;
    an oxide ceramic material;
    metal bonded to said ceramic material; and
    a ternary oxide between said oxide ceramic and said metal, said ternary oxide containing said metal.

* * * * *